United States Patent
Schriefer

(10) Patent No.: US 6,972,570 B2
(45) Date of Patent: Dec. 6, 2005

(54) QUICK-CONNECT BALLAST TESTING AND MONITORING METHOD AND APPARATUS

(76) Inventor: Jay R. Schriefer, 3212 Appian Way, El Dorado Hills, CA (US) 95762

( * ) Notice: Subject to any disclaimer, the term of this patent is extended or adjusted under 35 U.S.C. 154(b) by 0 days.

(21) Appl. No.: 10/776,724

(22) Filed: Feb. 11, 2004

(65) Prior Publication Data

US 2005/0174122 A1    Aug. 11, 2005

(51) Int. Cl.$^7$ .................. G01R 31/00; H05B 37/00
(52) U.S. Cl. ........................ 324/414; 315/86
(58) Field of Search ................ 324/403, 407, 324/408, 414; 315/227 R, 232, 86; 439/353

(56) References Cited

U.S. PATENT DOCUMENTS

| | | | |
|---|---|---|---|
| 4,634,204 A | | 1/1987 | Detter et al. ............... 439/347 |
| 4,695,803 A | * | 9/1987 | Rue ............................ 324/403 |
| 4,729,740 A | * | 3/1988 | Crowe et al. ............. 439/76.1 |
| 4,730,163 A | * | 3/1988 | Santos ....................... 324/414 |
| 4,884,978 A | | 12/1989 | Inaba et al. ................ 439/352 |
| 5,015,199 A | | 5/1991 | Hirano et al. .............. 439/353 |
| 5,597,233 A | * | 1/1997 | Lau ............................ 362/294 |
| 5,666,029 A | * | 9/1997 | McDonald .................. 315/86 |
| 5,798,617 A | * | 8/1998 | Moisin ....................... 315/247 |
| 6,097,191 A | * | 8/2000 | Jones, Jr. .................... 324/414 |
| 6,142,799 A | | 11/2000 | Marcel ....................... 439/152 |
| 6,179,643 B1 | | 1/2001 | Fukuda ....................... 439/358 |
| 6,364,683 B1 | | 4/2002 | Kohno ....................... 439/352 |
| 6,511,339 B1 | | 1/2003 | Huang ........................ 439/352 |
| 2002/0074958 A1 | * | 6/2002 | Crenshaw ............. 315/DIG. 5 |
| 2004/0263096 A1 | * | 12/2004 | Lott ........................... 315/291 |

* cited by examiner

Primary Examiner—Anjan Deb
(74) Attorney, Agent, or Firm—Dale J. Ream

(57) ABSTRACT

A monitoring and testing apparatus for quick-connection to a fluorescent lamp assembly includes a test circuit positioned in a casing and having wire receiving clips for quick receipt and release of wires from a ballast and lamp, whereby to electrically connect the ballast and lamp. The test circuit obtains voltage data from the ballast and lamp for evaluation indicative of operability. If either voltage data is out of a predictable range, an appropriate fault is stored in memory. When a diagnostic button is depressed by a user, the test circuit evaluates the state of the memory and energizes an appropriate LED to indicate if the ballast or lamp is inoperable. The quick-connect assembly enables a novice to correctly and quickly connect a ballast or lamps to the test apparatus and to diagnose an inoperable lamp assembly.

9 Claims, 6 Drawing Sheets

QUICK-CONNECT BALLAST TESTING AND MONITORING METHOD AND APPARATUS

BACKGROUND OF THE INVENTION

This invention relates generally to fluorescent lamp system ballasts and, more particularly, to a method and quick-connect apparatus for testing and monitoring a fluorescent lamp assembly ballast and lamps.

Fluorescent lights are more complex than incandescent lights. Main line electrical power can not be provided directly to a fluorescent light but must first be regulated by a ballast. Complex wiring systems of ballasts and fluorescent lighting systems has made their installation and maintenance a job for professional electricians rather than for ordinary maintenance personnel or the do-it-yourselfer.

The complexities of fluorescent light assemblies with a ballast make it difficult even for an electrician to determine whether an inoperable system is due to the ballast, a lamp, or an overall lack of electrical power. In the past, troubleshooting an inoperable system was often accomplished by trial and error, i.e. by replacing a bulb or ballast without really knowing what the source of the problem was.

Therefore, it would be desirable to have an apparatus for testing and monitoring the operability of a fluorescent lamp assembly and ballast. Further, it would be desirable that a ballast testing and monitoring apparatus be able to be quickly connected to a ballast such that the ballast could easily be replaced if necessary.

SUMMARY OF THE INVENTION

Accordingly, a method and apparatus for testing and monitoring the operability of a fluorescent light assembly and ballast includes a testing apparatus having a casing with a plurality of light emitting diodes (LED's). A test circuit is housed in the casing and may be connected to a primary power source such as main line A/C electricity. The ballast testing apparatus includes a wire clip assembly such that the test circuit can be quickly connected or disconnected from a fluorescent lamp assembly.

A ballast connected to the ballast testing apparatus may be tested and monitored when the primary power source is enabled in that ballast voltage data may be delivered to the test circuit at startup and during operation for evaluation. If, upon evaluation, the test circuit determines that the ballast is inoperable, an appropriate fault record may be stored in a memory. When the primary power source is disabled, e.g. when the fluorescent lamp is turned off, a second power source provides power to the test circuit so as to allow testing of the fluorescent lamps themselves. If, upon receiving and evaluating lamp voltage data, the test circuit determines a lamp is inoperable, another appropriate fault record is stored in memory.

Upon demand by pressing a diagnostic button on the casing, the test circuit energizes an appropriate LED according to the fault records in its memory. Therefore, a user is able to determine the precise cause of an inoperable fluorescent lamp assembly.

Therefore, a general object of this invention is to provide a method and apparatus for testing and monitoring operability of a fluorescent lamp assembly.

Another object of this invention is to provide a method and apparatus, as aforesaid, having a test circuit that may be quickly connected and disconnected from a fluorescent lamp assembly ballast.

Still another object of this invention is to provide a method and apparatus, as aforesaid, which can determine whether a fluorescent lamp or ballast itself is inoperable.

Yet another object of this invention is to provide a method and apparatus, as aforesaid, which visually indicates the source of inoperability.

A further object of this invention is to provide a method and apparatus, as aforesaid, having a secondary power source for use by the test circuit for testing operability of a fluorescent lamp.

Other objects and advantages of this invention will become apparent from the following description taken in connection with the accompanying drawings, wherein is set forth by way of illustration and example, embodiments of this invention.

DESCRIPTION OF THE PREFERRED EMBODIMENT

A quick-connect ballast testing and monitoring apparatus and method will now be described in detail with reference to FIGS. 1 through 6 of the accompanying drawings.

Figure 1:
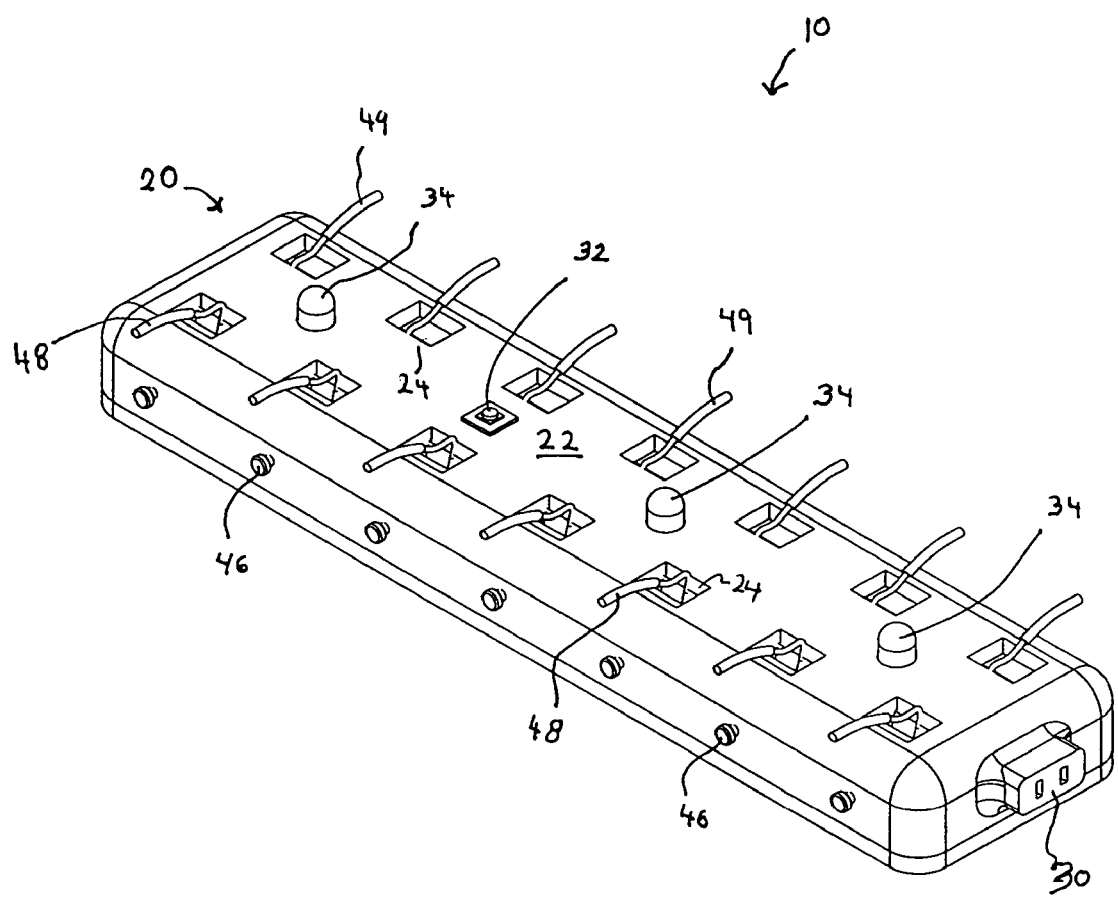
FIG. 1 is a perspective view of an apparatus for monitoring and testing a fluorescent lamp assembly and ballast according to a preferred embodiment of the present invention.
Figure 6:
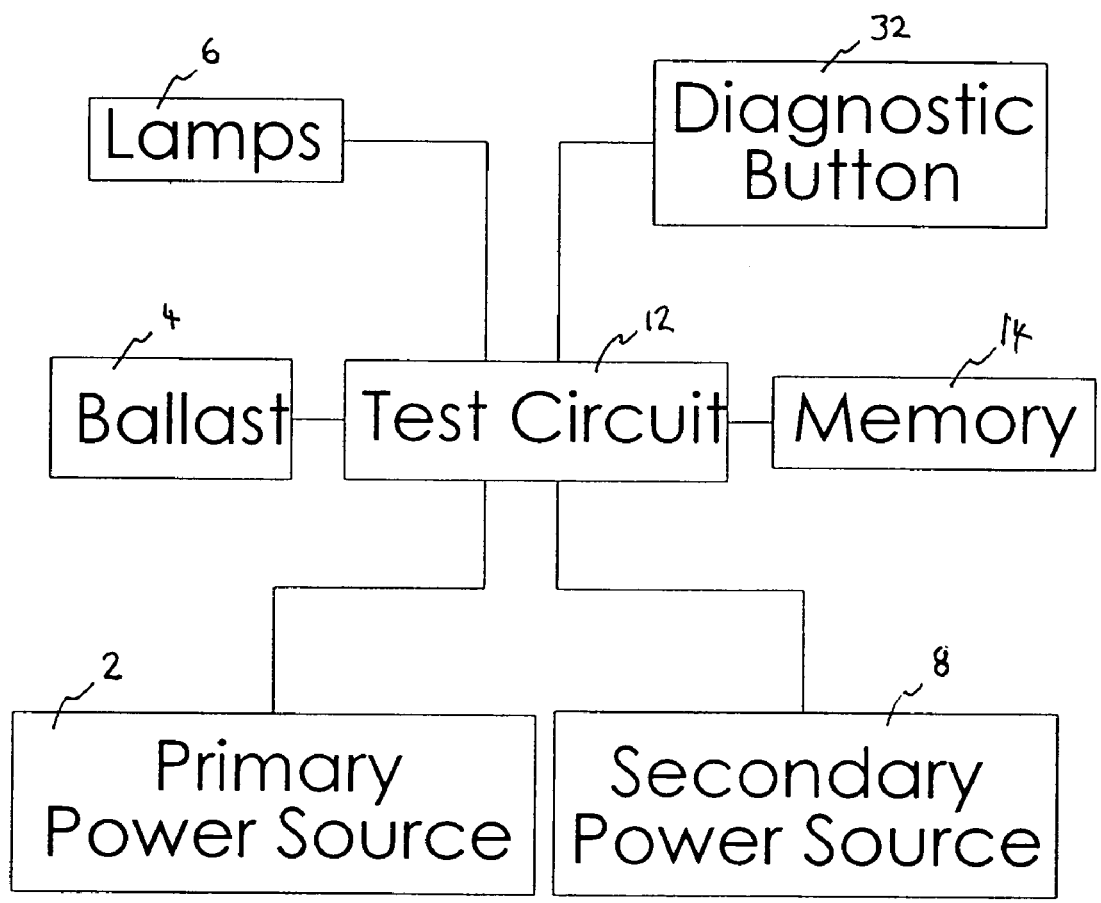
FIG. 6 is a block diagram of the apparatus as in FIG. 1 in use with a fluorescent lamp assembly.

An apparatus 10 for testing and monitoring a fluorescent lamp assembly according to one embodiment of the invention is shown in FIG. 1. While this apparatus 10 will be described in detail below, it should first be appreciated how the present invention may be utilized along with a conventional fluorescent lamp assembly having a ballast 4 and at least one fluorescent lamps 6 (FIG. 6). FIG. 6 is a block diagram illustrating schematically how the present apparatus 10 includes a test circuit 12 that may be electrically connected to a primary power source 2 such as A/C electrical power, to a lamp system ballast 4, and to at least one fluorescent lamps 6. The test circuit 12 may be connected thereto with quick connect components as will be described in more detail later. The test circuit 12 may be in the form of a programmable logic circuit (PLC) or conventional electronic components.

Figure 2:
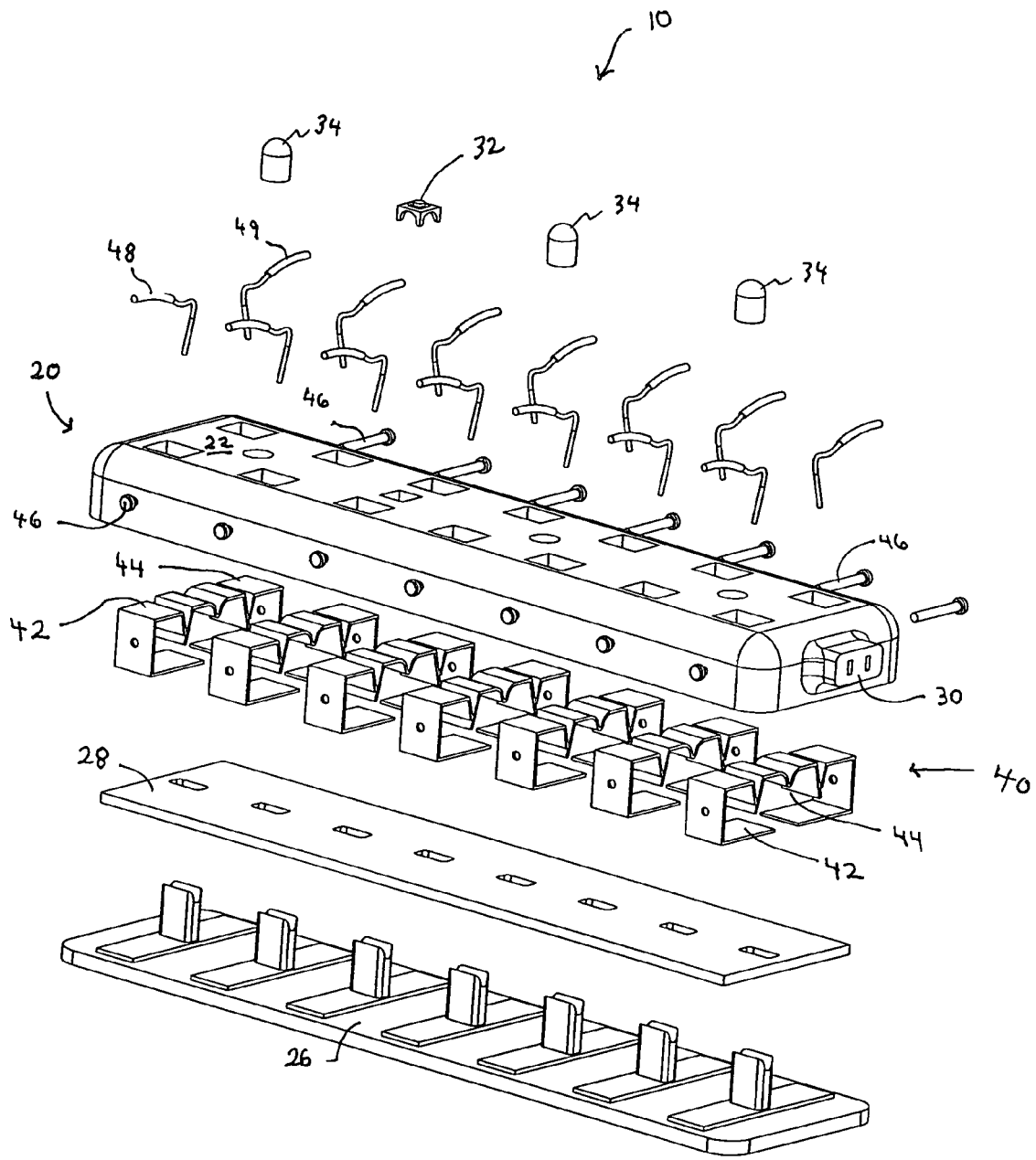
FIG. 2 is an exploded view of the apparatus as in FIG. 1.

The apparatus 10 includes a casing 20 includes an upper surface 22 with side walls depending therefrom. The upper surface 22 of the casing 20 defines a plurality of apertures 24 through which electrical wires may be inserted, as further described below. The casing 20 also includes a bottom wall 26 (FIG. 2). The test circuit 12 may be in the form of a circuit board 28 positioned within an interior chamber of the casing 20 and includes predetermined parameters, instructions, or circuitry for operation as described in more detail below. A memory 14 is also electrically connected to the test circuit 12. A plurality of spaced apart light sources 34 are positioned along the upper surface 22 of the casing 20 (FIG. 1), the plurality of light sources 34 having different colors and preferably being light emitting diodes (LED's) although LED's of the same color are possible if the casing 20 also includes appropriate interpretive indicia.

A conventional lamp assembly includes a lamp assembly ballast 4 and at least one lamps 6. These components may be quickly connected to the test circuit 12 or disconnected therefrom by means of a wire clip assembly 40 that is situated in the casing 20 (FIG. 2). The wire clip assembly 40 includes first 42 and second 44 sets of wire receiving clips for receiving and holding appropriate wires. The wire clip assembly 40 greatly simplifies the interconnections between the lamp assembly components as these wire connections are otherwise complicated and usually require professional electrician assistance. Specifically, the first set of clips 42 are adapted to receive bared ends of wires 48 of the lamps 6 while the second set of clips 44 are capable of receiving bared ends of wires 49 the lamp assembly ballast 4 (FIG. 2).

It is understood that the lamps and ballast typically have a total of 7 wires each—2 red, 2 blue, 2 yellow, and a black and white power wire. The casing 20 includes an electrical receptacle 30 for connection to the primary power source 2, e.g. A/C electrical power. Thus, power to the lamps 6 and ballast 4 can be completely disabled by unplugging the apparatus 10 itself as a safety feature when inserting or removing the other wires, etc. Of course, power to the lamps and ballast may be temporarily disabled by the usual operation of a light switch.

Wire receiving clips are also referred to as wire push connectors as a bared wire may be pushed into the clip and frictionally held therein. Wires are removable by gently depressing a corresponding wire release button 46 (FIG. 2).

The wire release buttons 46 are color coded to be indicative of the type of wire that should be inserted into appropriate wire receiving clips. For example, red, blue, and yellow wires are inserted into wire receiving clips 42, 44 having correspondingly colored wire release buttons 46, and so on. The lamp assembly will not work unless the colored wires are correctly connected. The color coded scheme is important so as to make use of the apparatus 10 accessible to an ordinary consumer without professional assistance.

The test circuit 12, when the apparatus 10 is connected between the ballast 4 and lamps 6, is able to test the operability of the ballast 4 and lamps 6. More particularly, FIGS. 3 and 4 provide a flowchart illustrating a methodology and circuit logic according to the present invention for monitoring and testing the operability of these components.

Figure 3:
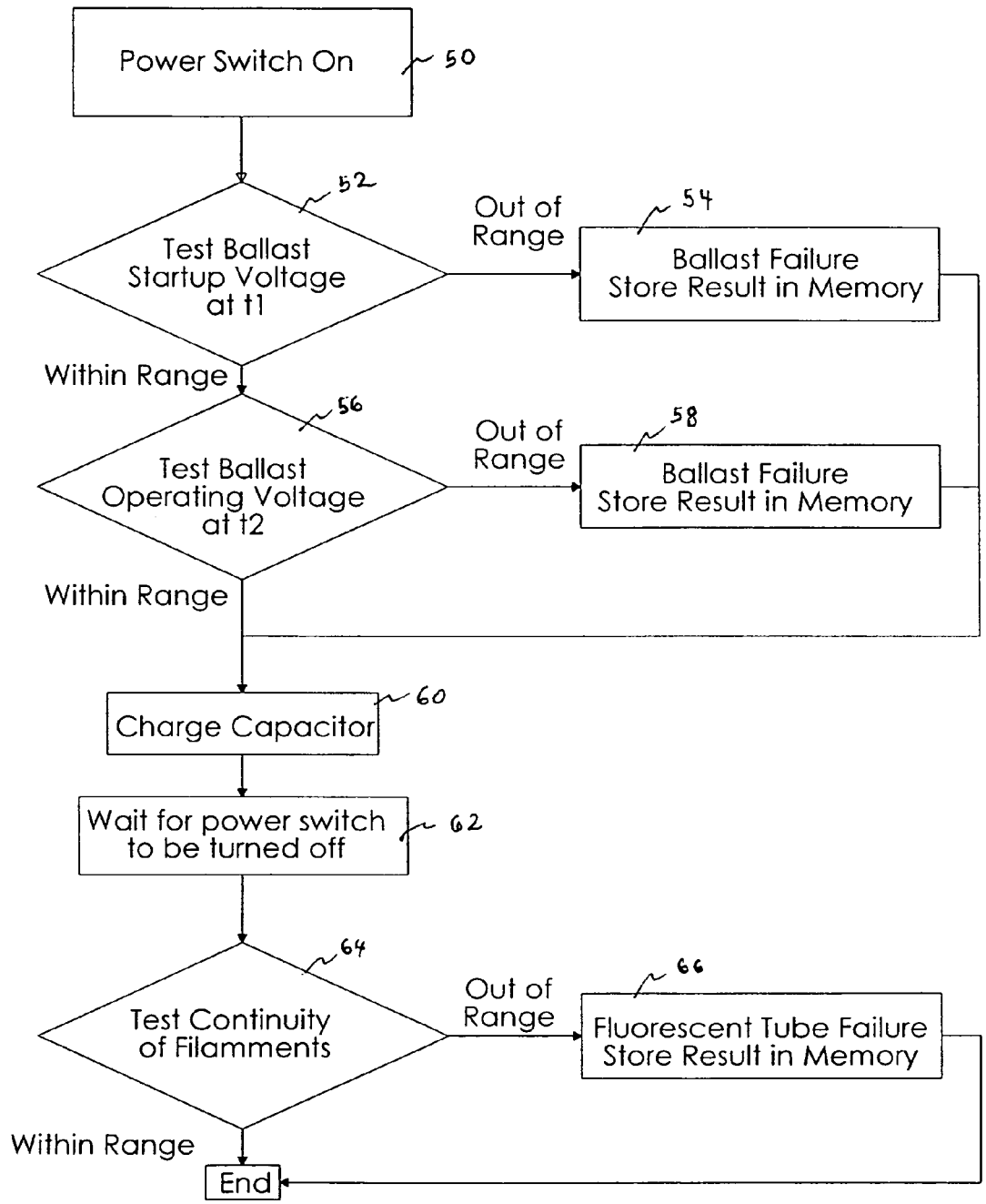
FIG. 3 is a flow chart showing the logic of a test circuit according to the one embodiment of the present invention.
Figure 4:
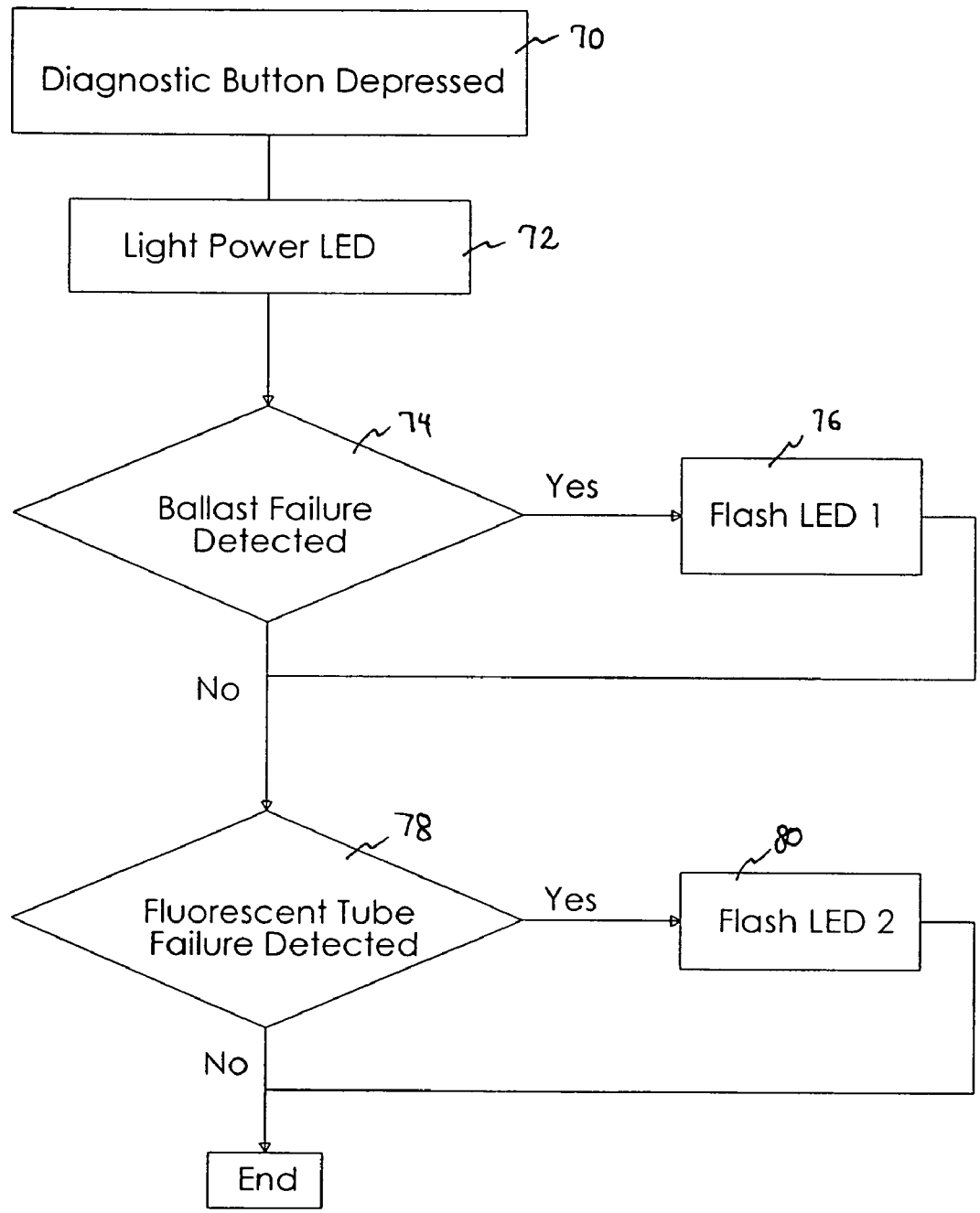
FIG. 4 is another flow chart showing the logic of the present invention.

Now with particular reference to FIGS. 3 and 4, the test circuit 12 is able to receive startup voltage data from the lamp assembly ballast 4 when the test circuit 12 and lamp assembly is enabled with electrical power, i.e. when the apparatus 10 is connected to primary power via its receptacle 30 and the lamps are switched on 50. The test circuit 12 compares this startup voltage with a predetermined startup voltage as indicated at block 52 and, if out of a predetermined range, stores a ballast fault record in memory 14, as indicated at 54 (FIG. 3).

Immediately after measuring and evaluating a startup voltage 52, the test circuit 12 measures and evaluates an operation voltage 56. If this voltage is outside a predetermined range, another ballast fault record is stored in memory 14, as indicated at 58. It is understood that a ballast exhibits a spike voltage at startup and then a reduced voltage during operation. According to this method, the test circuit 12 is able to test and monitor the operability of a fluorescent lamp assembly ballast 4.

Similarly, the test circuit 12 may monitor and test the operability of a fluorescent lamps 6 that is electrically connected to the apparatus 10. In this regard, the test circuit 12 is connected to a secondary power source 8 (FIG. 6) which immediately energizes the test circuit 12 when the primary power source 2 is not energizing the lamps and ballast, i.e. when the light switch to the lamps 6 is turned off. It is understood that references herein to the primary power source being disabled refers to the lamps 6 being shut off. This is in contrast to having primary power being completely disconnected from the power receptacle 30 for the safety reasons discussed previously.

Preferably, this secondary power source 8 is a capacitor although a battery would also work. The capacitor is charged 60 while the primary power source 2 is energizing the lamp assembly such that the capacitor may provide power to the test circuit 12 when the primary power source 2 is no longer energizing the lamp assembly, i.e. when the lamps are shut off 62. The lamps 6 are best tested when continuous voltage is not flowing; thus, this test is performed when the lamp assembly is switched off 62 (FIG. 3). The test includes passing a logically high voltage over the filaments of the fluorescent lamps 6 and evaluating an output voltage, as indicated at 64. If the output voltage, upon evaluation 64 by the test circuit, is a low voltage, then a lamp fault record may be stored in memory 14, as indicated at block 66 (FIG. 3).

It is important to note that the test circuit 12 does not immediately energize a light source 34 upon determining an inoperability of the ballast 4 or lamps 6. This is because the LED would not be very visible while the fluorescent lamps were emitting light. Therefore, the ballast fault is merely stored in memory 14 for later evaluation. The test circuit 12 may be energized by the secondary power source 8 (i.e. capacitor or battery) for the memory evaluation or by the primary power source 2. A diagnostic button 32 is positioned on the casing 20 (FIG. 1) and connected to the test circuit 12. When the diagnostic button 32 is pressed 70, a light source 34 corresponding to "power" is energized to indicate the test circuit 12 itself is operable 72 (FIG. 4). If a ballast fault record is found in memory 14 as indicated at 74, another appropriate LED is energized 76 to indicate inoperability of the ballast 4. Finally, if a lamp fault record is found in memory 14 as indicated at 78, yet another LED is energized 80 to indicate inoperability of a lamps 6.

In use, the testing and monitoring apparatus 10 may be interconnected to a lamp assembly ballast 4 and lamps 6. The color coded wire release buttons make installation simple enough for the do-it-yourselfer and novice. Specifically, the colored wire of fluorescent lamps 6 including power transfer wires may be inserted through appropriate apertures 24 of the casing upper surface 22 into connection with the corresponding first set of wire receiving clips 42. Similarly, the colored wires of a ballast 4 may be inserted through appropriate casing apertures 24 for connection with the corresponding second set of wire receiving clips 44. Therefore, this apparatus 10 greatly simplifies connections between a ballast 4 and fluorescent lamps 6.

Then, when primary power to the fluorescent lamps 6 is enabled (i.e. lamps switched on), the test circuit 12 evaluates startup and operation voltage as described and stores appropriate fault records in memory 14 if the evaluated voltage data is out of range. When primary power is disabled (i.e. lamps switched off), the secondary power source 8 takes over such that the test circuit 12 evaluates voltage data indicative of operability of the lamps 6. A lamp fault record is stored in memory if the voltage data is out of range. Finally, the test circuit 12 may evaluate the state of the memory 14 if the diagnostic button 32 is pressed, and appropriate light sources 34 are energized to indicate what components are faulty.

Figure 5:
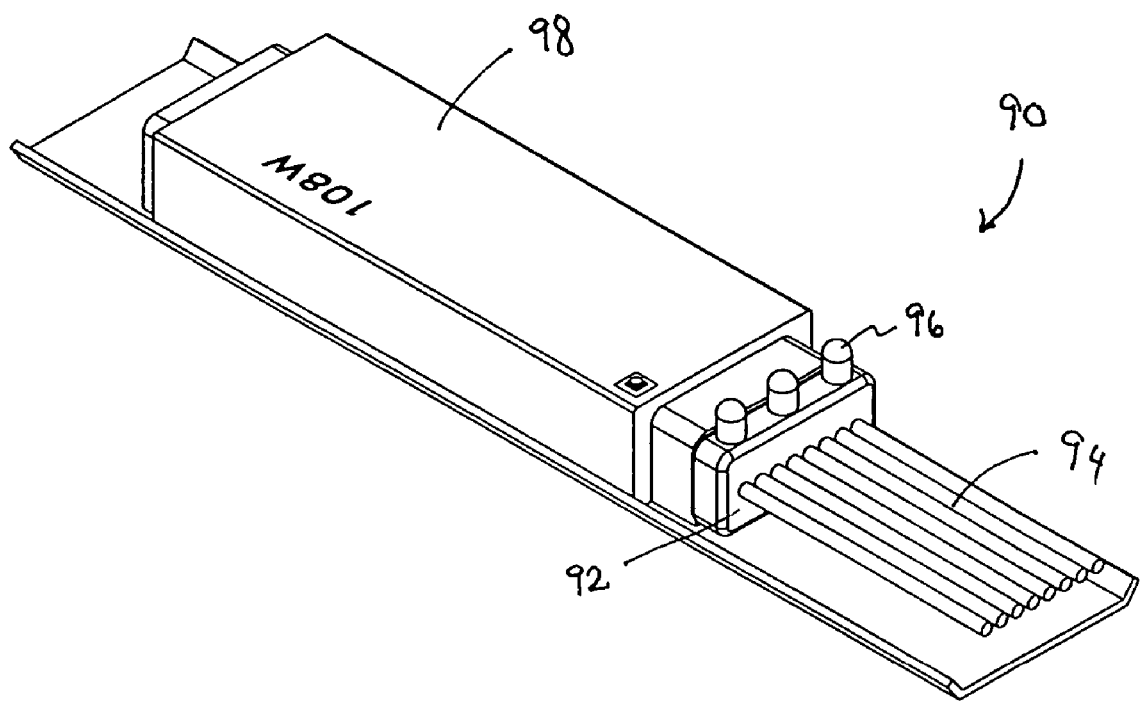
FIG. 5 is a perspective view of another embodiment of the present invention.

A ballast testing and monitoring apparatus 90 according to another embodiment is shown in FIG. 5. The apparatus 90 according to this embodiment includes a smaller casing 92 containing test circuitry or a logic chip that may be releasably coupled to a ballast 98 using a conventional plug-and-socket connection. Wires 94 extend from the casing 92 for connection to the lamps and power. LED's 96 for indicating faults are mounted atop the casing 92. While wire connections are simplified ever further in this embodiment, a special ballast 98 designed to plug-in to the casing 92 is needed. Preferably, such a ballast 98 would be sold along with the testing apparatus 90 although the ballast 98 could also be sold separately, i.e. for replacement when needed. The circuitry within this apparatus 90 would operate in a manner substantially similar to that previously described.

Accordingly, it can be seen that the apparatus 10 and method according to this invention makes connections between components of a fluorescent lamp assembly quick and simple and attainable by a novice. This invention also provides testing and monitoring of the operability of a fluorescent lamp assembly ballast and lamps so as to eliminate the trial and error repair of an inoperable assembly.

It is understood that while certain forms of this invention have been illustrated and described, it is not limited thereto except insofar as such limitations are included in the following claims and allowable functional equivalents thereof.

Having thus described the invention, what is claimed as new and desired to be secured by Letters Patent is as follows:

1. A ballast testing and monitoring apparatus for quick connection to a fluorescent lamp assembly having a lamp system ballast and at least one fluorescent lamp, said apparatus comprising:
   a casing having a plurality of light sources spaced apart along a top surface thereof;
   a test circuit positioned in said casing;
   a memory electrically connected to said test circuit;
   means for releasably electrically connecting said test circuit to a primary power source;
   means for releasably electrically connecting said test circuit to said lamp assembly ballast and to said at least one lamp;
   means in said test circuit for obtaining startup voltage data from said lamp assembly ballast for evaluation indicative of operability of said lamp assembly ballast; and
   means in said test circuit for storing a ballast fault record in said memory if said evaluated startup voltage data indicates inoperability of said lamp assembly ballast;
   said casing defines a plurality of apertures;
   said means for releasably electrically connecting said test circuit to said lamp assembly ballast includes a wire clip assembly situated in said casing, said wire clip assembly including:
      a first set of wire receiving clips positioned in accordance with respective casing apertures, each of said first set of wire receiving clips being configured to releasably receive a wire from said lamp system ballast; and
      a second set of wire receiving clips spaced from said first set of wire receiving clips and positioned in accordance with said respective casing apertures, each of said second set of wire receiving clips configured to releasably receive a wire from said at least one lamp;
   a secondary power source electrically connected to said test circuit, said secondary power source energizing said test circuit when said primary power source is disabled;
   wherein said secondary power source is a capacitor, said capacitor being charged when said primary power source is enabled;
   means in said test circuit for obtaining lamp voltage test data from said at least one lamp when said secondary power source is enabled and said primary power source is disabled for evaluation indicative of operability of said at least one lamp; and
   means in said test circuit for storing a lamp fault record in said memory if said evaluated lamp voltage test data indicates inoperability of said at least one lamp.

2. The ballast testing and monitoring apparatus as in claim 1 further comprising:
   means in said test circuit for obtaining operation voltage data from said lamp assembly ballast at a time after obtaining said startup voltage data for evaluation indicative of operability of said lamp assembly ballast; and
   means in said test circuit for storing another ballast fault record in said memory if said evaluated operation voltage data indicates inoperability of said lamp system ballast.

3. The ballast testing and monitoring apparatus as in claim 1 wherein said means for releasably electrically connecting said test circuit to the lamp assembly ballast includes a plug and socket connector.

4. The ballast testing and monitoring apparatus as in claim 1 further comprising:
   means in said test circuit for energizing one of said plurality of light source if said ballast fault record is stored in said memory; and
   means in said test circuit for energizing another of said plurality of light sources if said lamp fault record is stored in said memory.

5. The ballast testing and monitoring apparatus as in claim 1 further comprising means in said test circuit for energizing one of said plurality of light sources if said ballast fault record is stored in said memory.

6. A ballast testing and monitoring apparatus for quick connection to a fluorescent lamp assembly having a lamp system ballast and at least one fluorescent lamp, said apparatus comprising:
   a casing;
   a test circuit positioned in said casing;
   a memory electrically connected to said test circuit;
   means for releasably electrically connecting said test circuit to a primary power source;
   a wire clip assembly situated in said casing and having a plurality of wire receiving clips for releasably receiving wires from said lamp assembly ballast and said at least one lamp, said wire receiving clips electrically connecting said wires;
   a plurality of wire release buttons coupled to respective wire receiving clips, each wire release button including a color indicia corresponding to a color of a respective wire; and
   means in said test circuit for obtaining voltage data from said lamp assembly ballast for is evaluation indicative of operability of said lamp assembly ballast.

7. The ballast testing and monitoring apparatus as in claim 6 further comprising a secondary power source electrically connected to said test circuit, said secondary power source energizing said test circuit when said primary power source is disabled.

8. The ballast testing and monitoring apparatus as in claim 7 further comprising:
   means in said test circuit for obtaining lamp voltage test data from said at least one lamp when said secondary power source is enabled for evaluation indicative of operability of said at least one lamp; and
   means in said test circuit for storing a lamp fault record in said memory if said evaluated lamp voltage test data indicates inoperability of said at least one lamp.

9. A ballast testing and monitoring apparatus for quick connection to a fluorescent lamp assembly having a lamp system ballast and at least one fluorescent lamp, said apparatus comprising:
   a casing having a plurality of light sources spaced apart along a top surface thereof;
   a test circuit positioned in said casing;
   a memory electrically connected to said test circuit;
   means for releasably electrically connecting said test circuit to a primary power source;
   means for releasably electrically connecting said test circuit to said lamp assembly ballast and to said at least one lamp;
   means in said test circuit for obtaining startup voltage data from said lamp assembly ballast for evaluation indicative of operability of said lamp assembly ballast;
   means in said test circuit for storing a ballast fault record in said memory if said evaluated startup voltage data indicates inoperability of said lamp assembly ballast;
   said casing defines a plurality of apertures;
   said means for releasably electrically connecting said test circuit to said lamp assembly ballast includes a wire clip assembly situated in said casing, said wire clip assembly including:

a first set of wire receiving clips positioned in accordance with respective casing apertures, each of said first set of wire receiving clips being configured to releasably receive a wire from said lamp system ballast;
   a second set of wire receiving clips spaced from said first set of wire receiving clips and positioned in accordance with said respective casing apertures, each of said second set of wire receiving clips configured to releasably receive a wire from said at least one lamp;
   a plurality of wire release buttons coupled to respective wire release clips, each wire release button including a color indicia corresponding to a color of a respective wire;
   a secondary power source electrically connected to said test circuit, said secondary power source energizing said test circuit when said primary power source is disabled;
   wherein said secondary power source is a capacitor, said capacitor being charged when said primary power source is enabled;
   means in said test circuit for obtaining lamp voltage test data from said at least one lamp when said secondary power source is enabled and said primary power source is disabled for evaluation indicative of operability of said at least one lamp; and
   means in said test circuit for storing a lamp fault record in said memory if said evaluated lamp voltage test data indicates inoperability of said at least one lamp.

\* \* \* \* \*

UNITED STATES PATENT AND TRADEMARK OFFICE
CERTIFICATE OF CORRECTION

| | |
|---|---|
| PATENT NO. | : 6,972,570 B2 |
| APPLICATION NO. | : 10/776724 |
| DATED | : December 6, 2005 |
| INVENTOR(S) | : Jay R. Schriefer |

It is certified that error appears in the above-identified patent and that said Letters Patent is hereby corrected as shown below:

On the cover page, replace the informal drawing with the formal drawing of Fig 6.

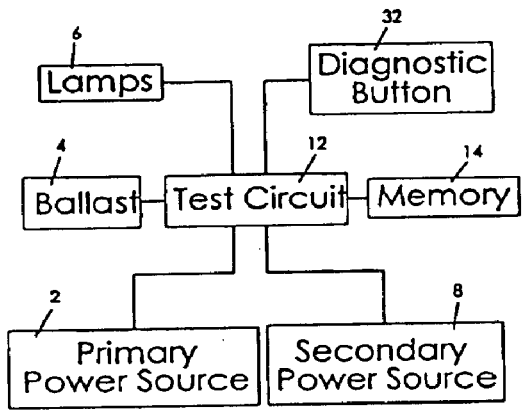

On drawing Sheet 1 of 6, replace the informal drawing of Fig 1 with the formal drawing of Fig 1.

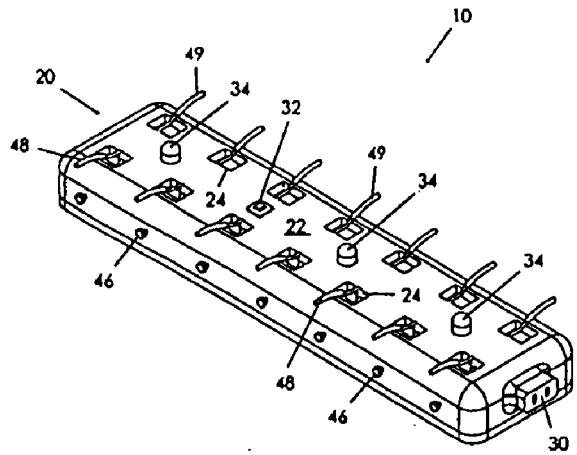

Fig. 1

UNITED STATES PATENT AND TRADEMARK OFFICE
CERTIFICATE OF CORRECTION

PATENT NO. : 6,972,570 B2  Page 2 of 4
APPLICATION NO. : 10/776724
DATED : December 6, 2005
INVENTOR(S) : Jay R. Schriefer It is certified that error appears in the above-identified patent and that said Letters Patent is hereby corrected as shown below:

On drawing Sheet 2 of 6, replace the informal drawing of Fig 2 with the formal drawing of Fig 2.

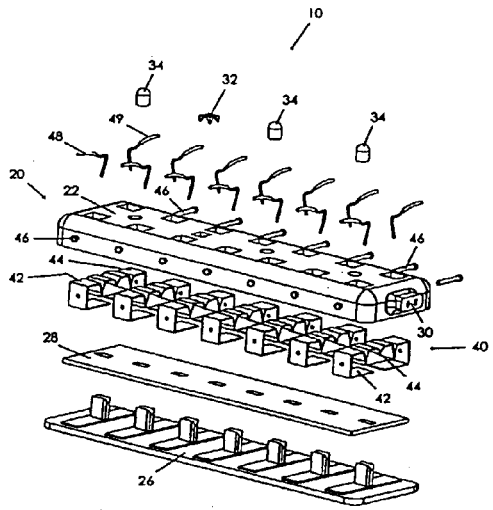

Fig. 2

On drawing Sheet 3 of 6, replace the informal drawing of Fig 3 with the formal drawing of Fig 3.

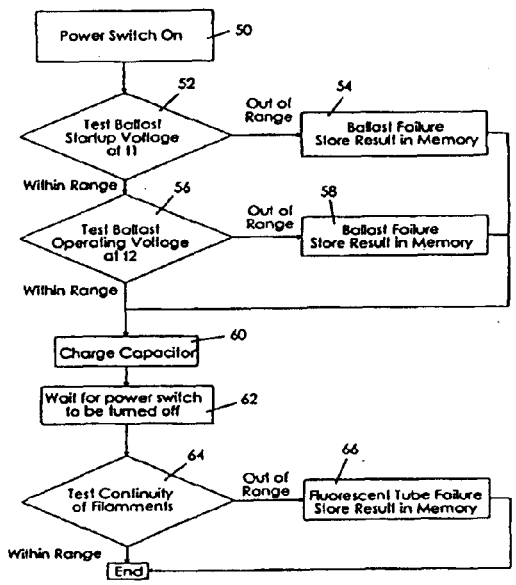

Fig. 3

UNITED STATES PATENT AND TRADEMARK OFFICE
CERTIFICATE OF CORRECTION

PATENT NO. : 6,972,570 B2  Page 3 of 4
APPLICATION NO. : 10/776724
DATED : December 6, 2005
INVENTOR(S) : Jay R. Schriefer It is certified that error appears in the above-identified patent and that said Letters Patent is hereby corrected as shown below:

On drawing Sheet 4 of 6, replace the informal drawing of Fig 4 with the formal drawing of Fig 4.

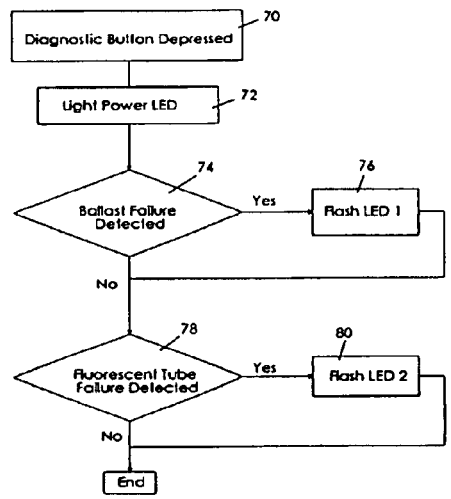

Fig. 4

On drawing Sheet 5 of 6, replace the informal drawing of Fig 5 with the formal drawing of Fig 5.

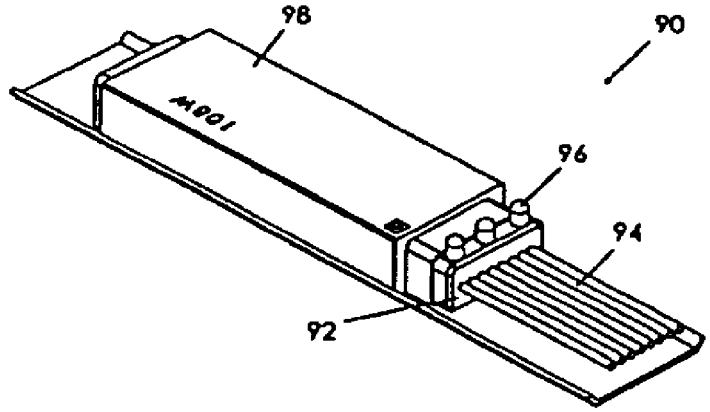

Fig. 5

UNITED STATES PATENT AND TRADEMARK OFFICE
CERTIFICATE OF CORRECTION

PATENT NO. : 6,972,570 B2
APPLICATION NO. : 10/776724
DATED : December 6, 2005
INVENTOR(S) : Jay R. Schriefer It is certified that error appears in the above-identified patent and that said Letters Patent is hereby corrected as shown below:

On drawing Sheet 6 of 6, replace the informal drawing of Fig 6 with the formal drawing of Fig 6.

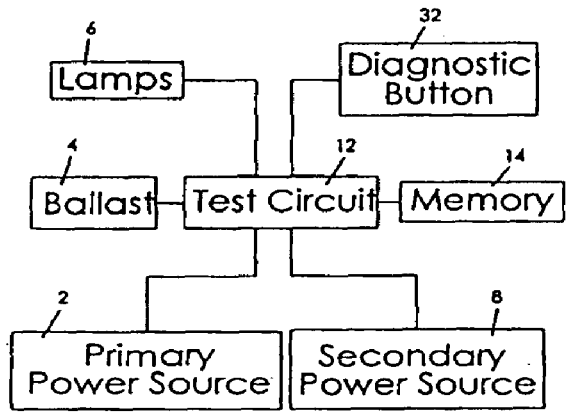

Fig. 6

Signed and Sealed this

Twenty-fourth Day of October, 2006

JON W. DUDAS
*Director of the United States Patent and Trademark Office*